(12) United States Patent
Karanovic

(10) Patent No.: US 6,778,600 B1
(45) Date of Patent: Aug. 17, 2004

(54) METHOD OF FILTERING AND APPARATUS THEREFORE

(75) Inventor: Marinko Karanovic, Don Mills (CA)

(73) Assignee: ATI International SRL, Christchurch (BB)

( * ) Notice: Subject to any disclaimer, the term of this patent is extended or adjusted under 35 U.S.C. 154(b) by 0 days.

(21) Appl. No.: 09/570,341

(22) Filed: May 12, 2000

(51) Int. Cl.$^7$ .................................................. H03H 7/30
(52) U.S. Cl. ........................................ 375/232; 375/350
(58) Field of Search ................................. 375/229, 232, 375/234, 350, 321, 355; 708/300, 313, 323; 341/61

(56) References Cited

U.S. PATENT DOCUMENTS

| | | | |
|---|---|---|---|
| 5,309,482 A | * 5/1994 | Wright et al. ............... 375/350 |
| 6,198,780 B1 | * 3/2001 | Kang ........................... 375/321 |
| 6,201,832 B1 | * 3/2001 | Choi ........................... 375/233 |
| 6,249,797 B1 | * 6/2001 | Kovacevic et al. ......... 708/300 |
| 6,400,781 B1 | * 6/2002 | Vandendorpe et al. ...... 375/350 |
| 6,430,234 B1 | * 8/2002 | Perlow ........................ 375/321 |
| 6,507,613 B1 | * 1/2003 | Majani ........................ 375/232 |

* cited by examiner

Primary Examiner—Don N. Vo
(74) Attorney, Agent, or Firm—Vedder, Price, Kaufman & Kammholz, P.C.

(57) ABSTRACT

A specific embodiment of the present invention discloses a method and apparatus for processing a digitized signal. Specifically, a digitized signal is received at a Lifting Scheme filter at a first data rate. The Lifting Scheme filter provides a representation of the digitized signal at a second rate. The Lifting Scheme filter can be implemented as a fully pipelined filter, or a recursively called filter.

15 Claims, 5 Drawing Sheets

METHOD OF FILTERING AND APPARATUS THEREFORE

FIELD OF THE INVENTION

The present invention relates to filtering techniques, and more particularly to the implementation of a digital filtering technique.

BACKGROUND OF THE INVENTION

The use of filtering techniques to process digital information is well-known. One class of filtering known in the industry is a Fractional Phase Delay Filter (FPDF) that is used in many different signal processing tasks. Examples of such tasks include digital beam forming, audio resampling, image/video resizing, and modem front end (baud rate synchronization). In a specific example, FPDF filters are used in high-speed modems to eliminate analog voltage control oscillator (VCO) sample rate control circuitry. By replacing the analog portion of the VCO control circuitry with an FPDF filter, the resulting design is less sensitive to operating environment variations, such as voltage, temperature, and noise.

Traditionally, FPDF filters have been implemented using Finite Impulse Response (FIR) filters. FIR filters are commonly used to implement digital filters on semiconductor devices. Generally, FIR filters include a plurality of taps wherein receive coefficient data is used to multiply an input value at the specific tap. For example, a 7-tap FIR filter would perform 7 multiplications for each new input value received.

When FIR filters are used to implement poly-phase filters, each phase can have a different set of coefficients. Therefore, either an index table of coefficient values needs to be maintained, or a method of generating coefficient values as needed is used. The number of phases in a system is dependent upon the design specification. However, for audio applications, the number of required phases can be tens-of thousands. When each phase requires plurality of coefficients, each of which can be two or more bytes in length, the storage space needed to save the coefficients, or the hardware needed to generate them is a significant resource in terms of the system area needed to store the values. In addition, generic multipliers are generally needed with such system to be able to handle the range of coefficient values.

Therefore, the amount of area required to implement poly-phase filters using FIR filters can be costly. Thus, a method and/or apparatus capable of implementing filtering techniques, such as FPDF filters, without the overhead associated with multiplication units and coefficient storage or generation would be useful.

It will be appreciated, that the Figures, and discussions relating to the Figures herein are of specific embodiments of the present invention.

DETAILED DESCRIPTION OF THE DRAWINGS

In accordance with a specific embodiment of the present invention, a FPDF filter is implemented using a Lifting Scheme. By using a Lifting Scheme, a fixed set of coefficients can be used to implement a desired synthesis function. In addition, the Lifting Scheme filter can be implemented using a half-band filter, which can reduce the number of calculations. Furthermore, the selection of a specific half-phase at any given level can be determined based upon an analysis of a single bit of a phase error signal. The specific implementation of the present invention is described herein by way of example with reference to FIGS. 1 through 6.

Figure 1:
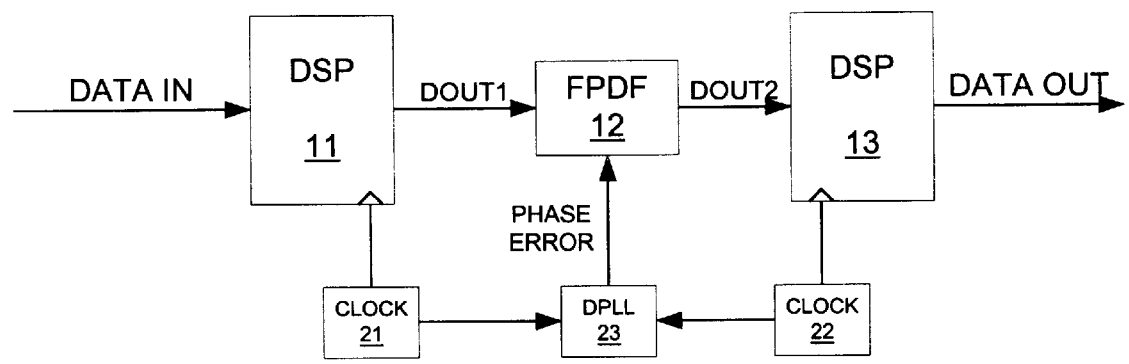
FIG. 1 illustrates, in block diagram form, a system utilizing a filter in accordance with the present invention.

FIG. 1 illustrates, in block diagram form, an FPDF filter 12 that uses a Lifting Scheme to interpolate digitized data between processing systems 11 and 13 that have different clock rates.

Specifically, a first digital signal processing (DSP) system 11 has a clock input that receives a clock signal generated from clock 21, a data input that receives data labeled DATA IN, and an output which provides a digital data signal DOUT1. FPDF filter 12 has a first input to receive a PHASE ERROR signal, a second input to receive the DOUT1 signal, and an output to provide a modified data out signal labeled DOUT2. A second digital signal processing system 13 has a clock input that receives a clock signal generated from clock 22, a data input that receives the DOUT2 data, and an output which provides a digital data signal labeled DATA OUT. A digital phase locked loop 23 has a first input for receiving a clock signal from clock 21, a second input for receiving a clock signal from clock 22, and an output for providing an error signal labeled PHASE ERROR.

In operation, the signal DOUT1 from DSP 11 is a digital representation of an analog signal at a first data rate. The signal DOUT1 must be converted to a signal DOUT2 before it can be used by DSP 13, which operates at a second data rate. This conversion from DOUT1 to DOUT2 is generally an interpolation of digitized data from DOUT1. This is better understood with reference to FIG. 2.

Figure 2:
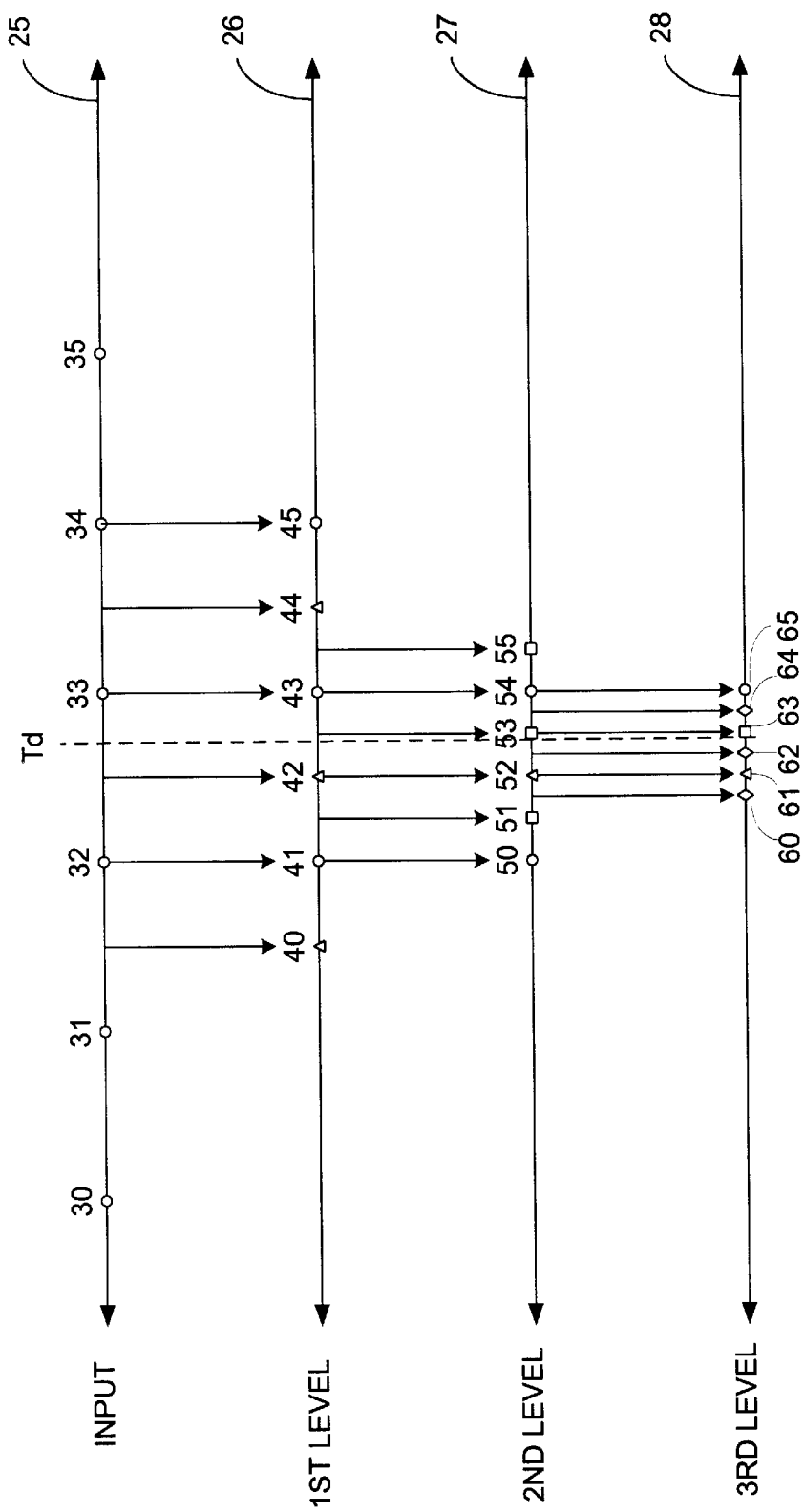
FIG. 2 illustrates a series of time lines used to describe a specific embodiment of the present invention.

FIG. 2 includes a time line 25 that illustrates 6 samples of a kernel for DOUT1. Note, each sample position 30–35 represents a digitized sample of DOUT1 at a specific point in time. For example, for a 32 kHz signal the sample 30–35 are ideally spaced by $\frac{1}{32}K$ seconds. Because DSP 13 operates at a different sample rate than DSP 11, it is typical that a specific sample time for which DSP 13 needs a digitized value will be different than the sample times available from DSP 11. For example, DSP 13 needs a digitized sample at a desired time labeled Td in FIG. 2. However, there is no digitized value at time Td, which lies between samples 32 and 33. The FPDF filter 12 uses a Lifting Scheme to provide an interpolated data value at time Td.

Figure 3:
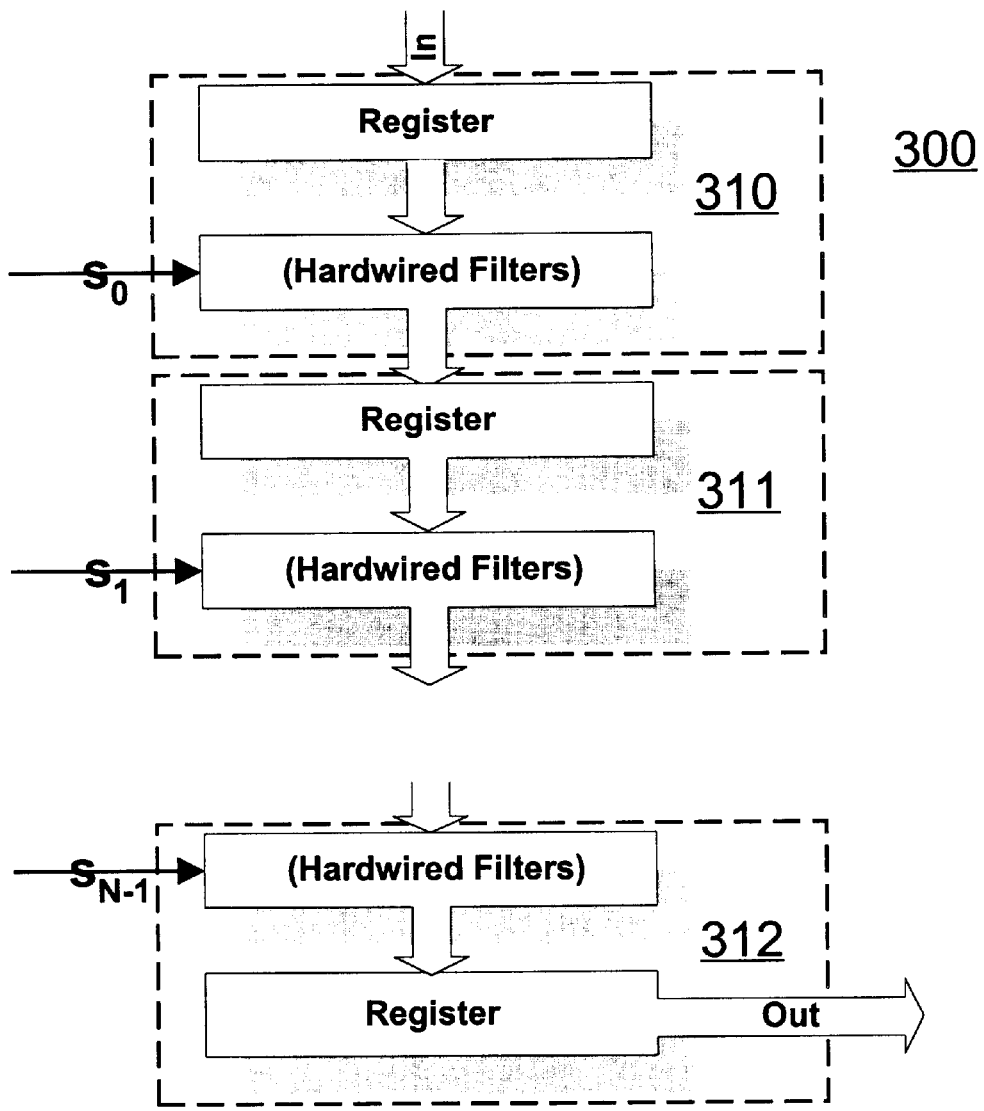
FIG. 3 illustrates, in block diagram form, a specific implementation of a filter in accordance with the present invention.

FIG. 3 illustrates a specific embodiment of a Lifting Scheme FPDF 12 in accordance with a specific embodiment of the present invention. Specifically, FIG. 3 illustrates a fully pipelined FPDF filter 300 having N stages, where only stages 310–312 are illustrated. The number of stages in FPDF filter 300 (N) is equal to a desired number of resolution levels. For the specific implementation herein, each resolution level increases the number of possible interpolated intervals between any two original samples by a factor of 2. For example, where the desired number of resolution levels is three, the first interpolation level results in 2 intervals between sample 32 and 33; the second interpolation level results in 4 intervals between samples 32 and 33, the third interpolation level results in eight intervals between samples 32 and 33. Note, 8 intervals result in 7 interpolated locations between the samples 32 and 33. Ultimately, the interpolated location closest to time Td is selected as the digitized value for the second rate.

Figure 4:
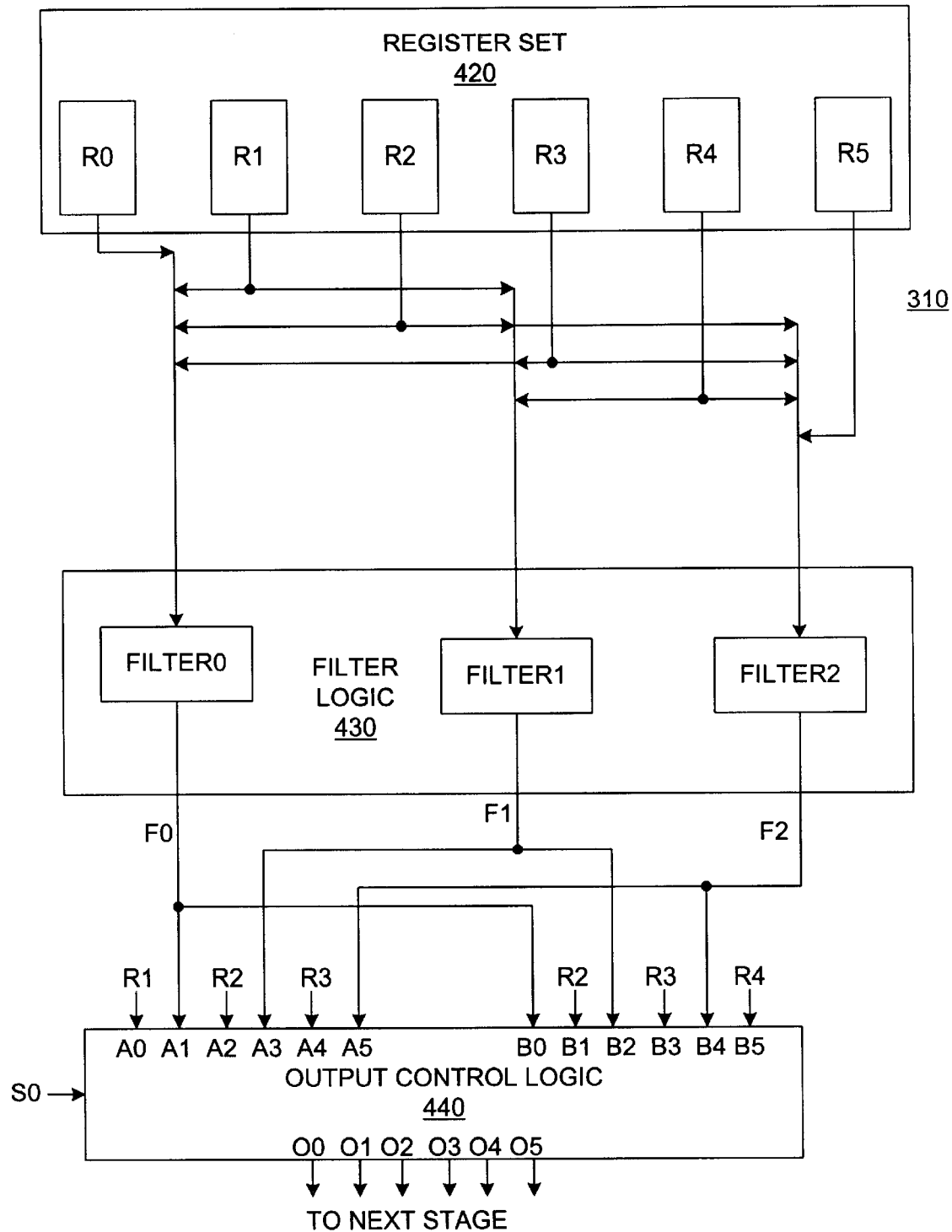
FIG. 4 illustrates, in block diagram form, a detailed view of a portion of the filter of FIG. 3.

FIG. 4 illustrates a specific filter implementation that can be used for stages 310–312. Specifically, the illustrated stage is stage 310, however, each of the N-stages will be identical in the implementation discussed herein. As illustrated, the stage 310 of the filter 300 includes a register set 420, a filter logic block 430, and output control logic 440. In the specific implementation of FIG. 4, the filter implemented is a 7-tap filter.

In operation, the six registers R0–R5 of stage 310 store the digitized values associated with samples 30–35 of FIG. 2. The registers R0–R5 provide data to the logic block 430. In a specific embodiment, the filter logic block 430 is a hardwired filter that generates three filter output values F0–F2. Each of the filter output values F0–F2 can be generated independently using separate filter logic portions Filter0–Filter2. As illustrated, Filter0 generates an output signal F0 based upon the contents of registers R0–R3, Filter1 generates an output F1 based upon the contents of registers R1–R4, Filter2 generates an output F2 based upon the contents of registers R2–R5.

In the specific embodiment, the filter 310 performs interpolation/upsampling using a second order Lagrange Half-Band filter where coefficients of (−1 0 9 1 6 9 0 −1)/32 are used. In this embodiment, a poly-phase technique is used, whereby during one phase of the filter there is only one non-zero coefficient. In this embodiment, the values of F0–F2 are calculated by the following equations:

$$F0 = (-1)(R0) + (9)(R0) + (9)(R2) + (-1)(R3); \quad (1)$$

$$F1 = (-1)(R1) + (9)(R2) + (9)(R3) + (-1)(R4); \quad (2)$$

$$F2 = (-1)(R2) + (9)(R3) + (9)(R4) + (-1)(R5). \quad (3)$$

The set of sample values 40–45 output at the first interpolation level is based upon the MSB of the Phase Error signal. Referring to FIG. 1, the Phase error signal is generated by the DPLL 23 which compares the clock 21 to the clock 22 value, where the clock 22 value is treated as a reference clock. The phase error value, provides a binary value between all zeros (0000) and a binary value of all ones (1111). When the MSB of the Phase Error signal is equal to zero, it is an indication that the desired time Td is in the lower half of the third time interval, (e.g. the interval between sample 32 and 33 for the first level). With respect to the filter 310 of FIG. 4, this means that a zero in the MSB of the PHASE ERROR signal will cause Port A of the multiplexer 440 to be selected. When Port A of the mutiplexer is selected, the filter values F0–F2 are output to the nodes O1, O3, and O5 respectively, and the input values from registers R1–R3 are output on nodes O0, O2, and O4 respectively.

Because the input values from the inputs are output directly, the lifting scheme FPDF filter 300 preserves the interpolation property. This is illustrated in FIG. 2, where time line 26 illustrates a portion of the value input to a level are provided as outputs. For example, the values calculated from filters F0–F2 at the first interpolation level are illustrated as triangles on the time lines 26–28, while the circles represent the non-altered values from time line 25. Therefore, in the specific embodiment illustrated, the original input value from sample 33 is passed through all three levels to become value 65.

In the specific embodiment illustrated, the MSB of the Phase Error was equal to one, thereby indicating that the desired time Td was in the upper half of the period between sample 32 and sample 33. As a result, the newly calculated values from the filters F0–F2 were provided as samples 40, 42, and 44, while the samples 41, 43, and 45 were the non-altered values from the previous level.

The sample values 40–45, which correspond to output nodes O0–O5 of FIG. 4, are then used as inputs to the registers R0–R5 associated with the next stage 311 (not illustrated) of the fully pipelined filter 300. At the Stage 311, the filter operates in a similar manner, however, values output are controlled by the next MSB bit of the Phase Error signal. This iterative process can continue for as many stages as there are valid next MSB bits to control the process. For example, if the DPLL generates a Phase Error that is accurate for 10 bits, ten stages can be supported.

FIG. 2 illustrates a three level interpolation, whereby the interpolated value provided to DSP 13 would be the digitized value of sample 63 of level 3.

In one embodiment, the fixed coefficients of the filter 300 are sums of powers of 2, thereby allowing for an implementation of the filter 300 that is independent of any generic multipliers that perform multiplication for a broad range of numbers. For example, generic multipliers can multiply any number within a specified upper limit and lower limit. Limiting the fixed coefficients to sums of powers of two allows the multiplication arithmetic of equations (1)–(3) to be performed using shifters and adders, instead of by using generic multipliers. By eliminating the need for generic multipliers, the area needed to implement filter 300 is reduced. Note, in a specific embodiment, the filter 300 will be implemented on a semiconductor device, such as a graphics processor, audio processor, and/or other digital devices.

The fully pipelined filter of FIG. 3 results in a high speed filter at the cost of area. The fully pipelined implementation requires separate register sets and logic blocks for each interpolation level. However, being fully pipelined, a new interpolated value is generated with each clock cycle once the pipeline is full.

Figure 5:
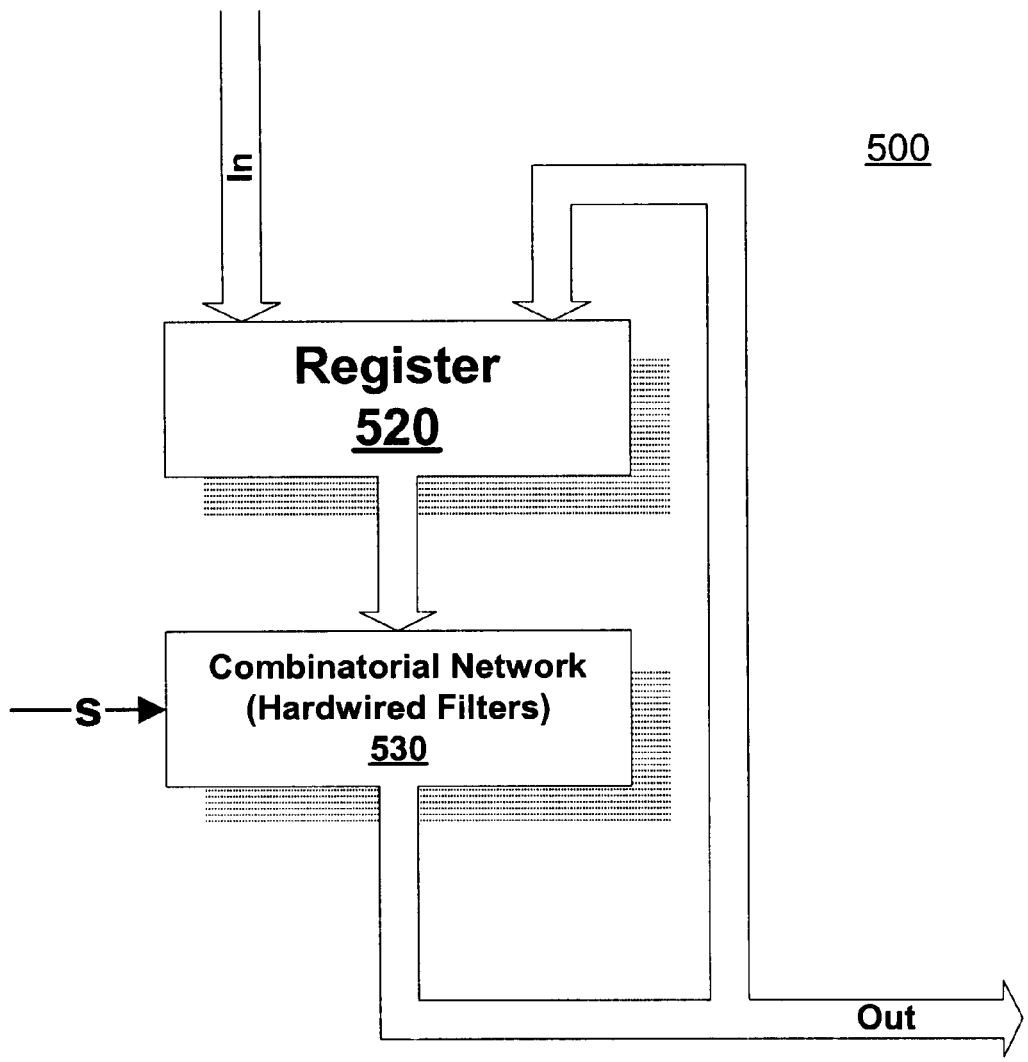
FIG. 5 illustrates, in block diagram form, another specific implementation of a filter in accordance with the present invention.

FIG. 5 illustrates an alternate implementation of a Lifting Scheme FPDF filter 500. The Filter 500 is iterative between resolution levels, and therefore does not use multiple register and filter sets. Instead, a single register set 520 and filter portion 530 are reused for each resolution level. As a result, a design that is more space efficient is realized at the cost of additional execution time, as compared to the fully pipelined filter of FIG. 3. In operation, the FPDF filter 500 uses an iterative loop between the output of the filter logic block 530, and the register set 520 registers to eliminate multiple register sets and filters. The FPDF filter 500 provides a new interpolated value every N clock cycles, where N is the number of interpolation levels, while the fully pipelined implementation provides a new interpolated value with each clock. This decrease in output performance allows for reduced area for implementation of the filter.

In addition to being a hardware efficient implementation, the implementation of the filter 500 allows for a system that allows recursive software calls to the filter of FIG. 5. Because recursive software calls can be made, the number of lines of code to access the hardware described can be reduced. Conversely, the software needed to access lookup tables, or to generate coefficients used by known filters can be significant, resulting in increased development time, execution time, and storage space.

In addition to the filter illustrated in FIG. 5, which is recursive between resolution levels, it will be appreciated that an implementation that is recursive within each resolution level, and between resolution levels is possible. In this embodiment, one filter would be recursively called to implement the functions of the filters Filter0–Filter2 of FIG. 4. Such an implementation will reduce the area of the filter even further at the cost of performance.

Figure 6:
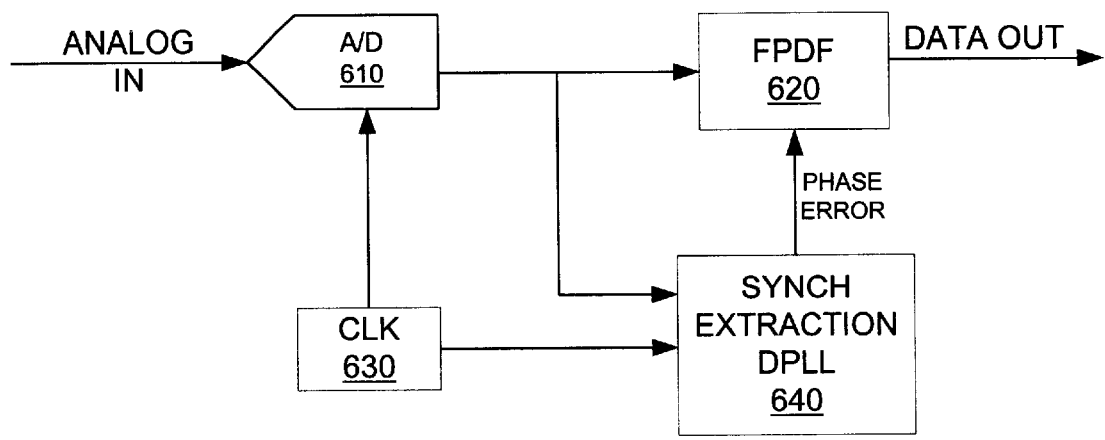
FIG. 6 illustrates in block diagram form, another system utilizing a filter in accordance with the present invention.

FIG. 6 illustrates another system implementing a Lifting FPDF filter 620. Specifically, the system of FIG. 6 converts a signal labeled ANALOG IN to a digitized signal at a sample rated controlled by clock 630. In a specific implementation, the digitized signal includes a synchronization signal that is extracted by the DPLL 640. In addition, the DPLL generates a PHASE ERROR signal by comparing the extracted synchronization signal to the clock 630. This comparison generates the PHASE ERROR signal when an expected relationship is not met. The FPDF 620 uses this PHASE ERROR to generate the interpolated data labeled DATA OUT as described herein.

It will now be appreciated by one of ordinary skill in the art that the specific embodiments described herein are an improved method of implementing a filter. Due to the properties of the Lifting Scheme used to implement the filter, fixed coefficients can be used, a single register/filter set can be recursively called to obtain a desired number of phases. It will further be appreciated that while the specific embodiments described herein are for an interpolating filter, that other types of filters are also anticipated herein. Furthermore, it will be understood that for certain filter functions, such as decimation functions, it will be necessary to have filter logic for both the odd and even phases of the filter. This can be readily accomplished by adding additional filter portions within the filter logic block 430 of FIG. 4, or by using additional recursive calls to a specific filter.

I claim:

1. A method of processing a digitized signal, the method comprising:
   receiving a digitized signal at a first data rate; and
   providing a representation of the digitized signal at a second rate, wherein the representation of the digitized signal is at least partially based upon a Lifting Scheme and implementing the Lifting Scheme using a digital filter wherein the digital filter uses coefficients that are sums of powers of 2; and
   wherein the digital filter is implemented independent of any generic multipliers.

2. The method of claim 1, wherein the digital filter is a fractional phase delay filter (FPDF).

3. The method of claim 1, wherein the step of providing includes preserving interpolation property.

4. The method of claim 1, wherein the filter is a poly-phase filter.

5. The method of claim 1, wherein the filter is a half-band filter.

6. A filter apparatus, the filter apparatus including:
   a phase error generator having an output to provide a phase error signal;
   wherein the phase error signal comprises N-bits, where N is representative of a desired number of resolution levels; and
   a Lifting Scheme filter having a control input coupled to the output of the phase error generator, an input for receiving a digitized input value at a first data rate, and an output for providing a digitized output value at a second data rate.

7. The filter apparatus of claim 6 further comprising the Lifting Scheme filter being a half band filter.

8. The filter apparatus of claim 6 further comprising the Lifting Scheme filter being a poly-phase filter.

9. The filter apparatus of claim 6 further comprising the Lifting Scheme filter being fully pipelined.

10. The filter apparatus of claim 6 further comprising the Lifting Scheme filter being iterative between resolution levels.

11. The filter apparatus of claim 6 further comprising the Lifting Scheme filter preserving interpolation property.

12. A method of processing a digitized signal, the method comprising:
   receiving an input digitized signal at a first data rate;
   providing an output digitized signal that is representative of the input digitized signal at a different rate, wherein the output digitized signal is at least partially based upon a Lifting Scheme; and
   recursively calling the step of providing until a desired number of phases is obtained, wherein the output digitized signal is used as a new input digitized for each recursive call.

13. A method of processing a digitized signal, the method comprising:
   receiving a digitized signal at a first data rate;
   providing a representation of the digitized signal at a second rate, wherein the representation of the digitized signal is at least partially based upon a Lifting Scheme;
   receiving N-bits of a phase error signal, where N is representative of a desired number of resolution levels, and the phase error signal is based at least partially upon the first data rate; and
   wherein the step of providing further includes controlling the Lifting Scheme at least partially based upon the phase error signal.

14. The method of claim 13, wherein
   the step of receiving the digitized signal includes a set of samples;
   determining a first plurality of subsample locations based upon the set of samples;
   selecting a first subset from the first plurality of subsamples based upon the Most Significant Bit (MSB) of the phase error signal; and
   determining a second plurality of subsample locations based upon the first subset.

15. The method of claim 14, wherein
   selecting a second subset from the second plurality of subsamples based upon the next MSB (MSB-1) of the phase error signal; and
   determining a third plurality of subsample locations based upon the subset of the first plurality of subsamples.

* * * * *